United States Patent [19]

Ogita

[11] 4,112,371

[45] Sep. 5, 1978

[54] MUTING AND TUNING INDICATOR SYSTEM FOR AN FM RECEIVER

[75] Inventor: Minoru Ogita, Hamamatsu, Japan

[73] Assignee: Nippon Gakki Seizo Kabushiki Kaisha, Hamamatsu, Japan

[21] Appl. No.: 719,150

[22] Filed: Aug. 31, 1976

[30] Foreign Application Priority Data

Sep. 3, 1975 [JP] Japan .................. 50/106057

[51] Int. Cl.² ............... H04B 1/10; H04B 1/16
[52] U.S. Cl. ................... 325/319; 325/348; 325/398; 325/403; 325/478
[58] Field of Search ............ 325/398, 402, 403, 364, 325/319, 455, 348, 478

[56] References Cited

U.S. PATENT DOCUMENTS

| 3,569,840 | 3/1971 | Tanaka et al. ............ 325/478 |
| 3,699,457 | 10/1972 | Wright ................... 325/348 |
| 3,719,892 | 3/1973 | Yamazaki et al. ......... 325/402 |
| 3,728,634 | 4/1973 | Watkinson .............. 325/478 |

Primary Examiner—Robert L. Griffin
Assistant Examiner—Marc E. Bookbinder
Attorney, Agent, or Firm—Cushman, Darby & Cushman

[57] ABSTRACT

In an FM receiver, the noise component is extracted from the output of the FM detector of the receiver, and the extracted noise component is rectified by a rectifier circuit. The output of this rectifier circuit serves as a driving signal for the tuning indicator or the muting circuit of the receiver.

10 Claims, 4 Drawing Figures

MUTING AND TUNING INDICATOR SYSTEM FOR AN FM RECEIVER

BACKGROUND OF THE INVENTION a. Field of the Invention

The present invention concerns an FM receiver, and more particularly it relates to a tuning indicating system and a muting system in an FM receiver.

b. Description of the Prior Art

The tuning indicating system and the muting system of a conventional FM receiver, in general, are arranged to be operative so that a signal is derived from the intermediate frequency (IF) amplifying circuit of the FM receiver, and the signal thus derived is rectified by a rectifier, and the output of this rectifier is used to drive the switching element of the tuning indicating system and the muting system. However, these known tuning indicating system and muting system tend to induce such adverse effects in the IF amplifying circuit as an abnormal oscillation phenomenon of the IF amplifying circuit, or a beat phenomenon occurring between the harmonics which develops during the rectification and the IF signal. In addition thereto, said known systems tend to complicate the IF amplifying circuit arrangement. Furthermore, these known systems are easily accompanied by such problem that the tuning indicating characteristic and the muting characteristic are affected by the frequency characteristics of both the IF amplifying circuit and the radio frequency amplifying circuit of the FM receiver.

SUMMARY OF THE INVENTION

It is, therefore, an object of the present invention to provide a tuning indicating system and a muting system in an FM receiver, which are free of such drawbacks and inconvenience as mentioned above and encountered in the prior art.

Another object of the present invention is to provide a tuning indicating system and a muting system of the type described above, which do not affect any one of the intermediate frequency circuit and the radio frequency circuit of an FM receiver.

In the tuning indicating system and the muting system according to the present invention, there are provided a filter circuit for extracting only the noise component from the output of the FM detector in an FM receiver after excluding the signal component from said output, and a rectifier circuit for rectifying the extracted noise component. The output of the rectifier circuit is used to drive the tuning indicator of the tuning indicating system and the muting circuit of the muting system.

These and other objects as well as the features and the advantages of the present invention will become more clearly understood by reading the following detailed description of the preferred embodiment when taken in conjunction with the accompanying drawings which are given simply by way of example.

DETAILED DESCRIPTION OF THE PREFERRED EMBODIMENTS

Figure 1:
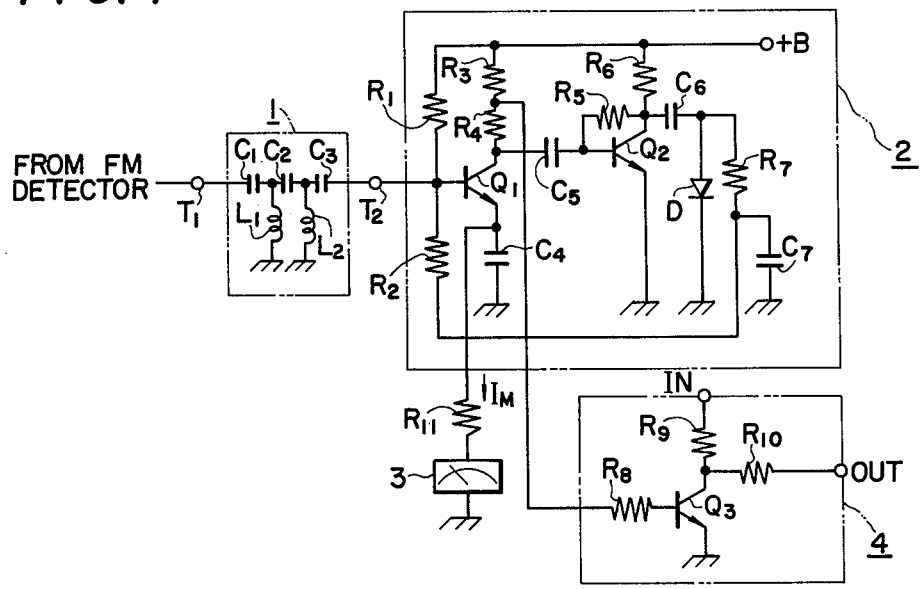
FIG. 1 is a circuit diagram showing an example of the tuning indicating system and the muting system according to the present invention.
Figure 4:
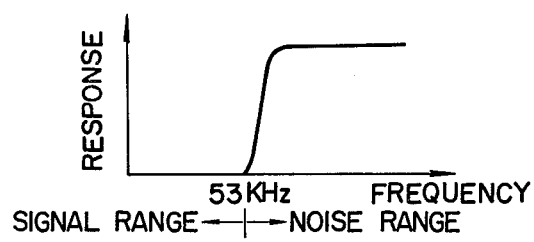
FIG. 4 is a chart showing the frequency characteristic of the high-pass filter included in the muting indicating system and the muting system shown in FIG. 1.

In FIG. 1 is shown an example of the tuning indicating system and the muting system according to the present invention. In FIG. 1, reference numeral 1 represents a high-pass filter having such a frequency characteristic as shown in FIG. 4. This filter 1 includes capacitors $C_1$, $C_2$ and $C_3$ and inductors $L_1$ and $L_2$. To the input terminal $T_1$ of this filter 1 is applied the output of the FM detector in an FM receiver. It should be understood, however, that the FM receiver per se is not shown, because its arrangement may be of a conventional form. The output at a terminal of the filter 1 is inputted to a rectifier circuit 2. This rectifier circuit 2 includes transistors $Q_1$ and $Q_2$. The base electrode of the transistor $Q_1$ is connected to a power source $+B$ via a resistor $R_1$ and further it is coupled to an output terminal $T_2$ of the filter 1. The collector electrode of the transistor $Q_1$ is connected to the power source $+B$ via resistors $R_3$ and $R_4$. The emitter electrode of the transistor $Q_1$ is grounded via a capacitor $C_4$ and a series connection of a resistor $R_{11}$ and a tuning indicator 3. The collector electrode of the transistor $Q_2$ is connected to the power source $+B$ via a resistor $R_6$. The emitter electrode of this transistor $Q_2$ is grounded. The base electrode of the transistor $Q_2$ is coupled to the collector electrode of the transistor $Q_1$ via a capacitor $C_5$, and to the collector electrode of the transistor $Q_2$ via a resistor $R_5$. Also, the collector electrode of the transistor $Q_2$ is grounded via a capacitor $C_6$ and a diode D. The point of connection between the capacitor $C_6$ and the diode D is connected to the base electrode of the transistor $Q_1$ via resistors $R_7$ and $R_2$. Thus, the transistor $Q_1$ constitutes a forward automatic gain control (AGC) circuit for stabilizing the operation of the rectifier 2. The connection point of these resistors $R_7$ and $R_2$ is grounded via a capacitor $C_7$. Reference numeral 4 represents a muting circuit. This muting circuit 4 is composed of: a series connection of resistors $R_9$ and $R_{10}$ forming a signal path through which flows an audio signal in an FM receiver not shown; a transistor $Q_3$ connected in shunt between the junction point of the resistors $R_9$ and $R_{10}$ and the ground; and a resistor $R_8$. The base electrode of the transistor $Q_3$ is connected to the junction point of the resistors $R_3$ and $R_4$ via the resistor $R_8$.

Figure 2:
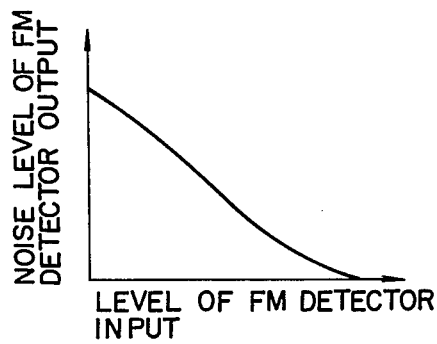
FIG. 2 is a chart showing the relationship between the level of the noise component contained in the output of the FM detector in an FM receiver and the level of the input to the FM rectifier.
Figure 3:
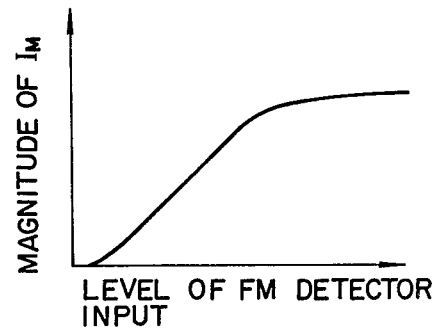
FIG. 3 is a chart showing the relationship between the current flowing through the tuning indicator included in the tuning indicating system shown in FIG. 1 and the level of the input to the FM detector.

The operation of the circuit of FIG. 1 will be described by referring to FIGS. 2 to 4. When the input signal level applied to the input terminal IN is sufficiently high, the noise component from the FM demodulator is very small as shown in FIG. 2. Here, since the output of the FM demodulator is supplied through a high pass filter (HPF) having the characteristic as shown in FIG. 4 to the base of the transistor $Q_1$, the signal component is prevented from passing through the HPF and only the noise component is applied to the base of the transistor $Q_1$. In this state, the resistances $R_1$, $R_2$ and $R_7$ and the diode D are so arranged as to bias the transistor $Q_1$ for allowing a meter current $I_M$ to flow through the transistor $Q_1$ and to let the tuning indicator M show the full scale indication. When the level of the input signal applied to the input terminal IN decreases, the noise level increases as shown in FIG. 2. This noise component is applied to the base of the transistor $Q_1$ through the high pass filter HPF. Then, the noise component is amplified in the transistors $Q_1$ and $Q_2$, and the amplified output is rectified in the rectifier circuit consisting of the capacitors $C_6$ and $C_7$, the diode D and the resistor $R_7$ and then is fed back to the base of the transistor $Q_1$ through the resistor $R_2$. Thus, a negative dc bias is applied to the base of the transistor $Q_1$ and hence the dc collector current decreases therewith. This decrease in the collector current of the transistor $Q_1$ leads to the decrease in the bias current in the automatic gain control amplifier AGC and hence the deflection of the indicator needle in the tuning indicator M. Thus, the current $I_M$ flowing through the tuning indicator meter M changes with the change of the input signal level as shown in FIG. 3. In this way, the state of the input signal can be indicated in the tuning indicator meter M by driving it with the noise component included in the FM demodulated signal. Thus, this embodiment provides the advantages of giving no influence to the HF system and of allowing high degrees of freedom in the design since it utilizes the noise component in the FM demodulated signal. Further, it is also advantageous in the point that the fluctuations in the indication of the tuning indicator meter is extremely low since the fluctuations in the HF system have no direct relation to the indication of the meter. Yet further, since the quality of the received signal such as the deteriorations of the S/N ratio due to the level change, multi-path interference, and the beat interference by the mixing, is directly indicated in the tuning indicator M, indication well responsive to the S/N ratio in the audible sense can be achieved.

Next, the operation of the muting circuit 4 will be described. Here, to help understanding this invention, the function of the muting circuit will be described first. A muting circuit is a circuit for automatically controlling (cutting) the audio output when the input signal is weak and the S/N ratio is low (i.e. when the tuning is not performed), thereby to generate the audio output only when the input signal is strong and the S/N ratio is high to some extent (i.e. when the tuning is performed). Namely, in an FM receiver circuit of high gain when no particular signal is received, external and internal noises of the receiver are amplified to generate a large noise output which is very offensive to the ear. Therefore, when no particular signal is received, the audio signal is cut off by the muting circuit utilizing the control signal based on the noise component. When the input signal level applied to the input terminal IN is high and the transistor $Q_1$ of the rectifier circuit 2 is turned on, no current is allowed to flow through the base of the transistor $Q_3$ of the muting circuit and the transistor $Q_3$ is turned off. In this case, the audio signal applied to the terminal IN is supplied to the output terminal OUT through the resistors $R_9$ and $R_{10}$. When the input signal level applied to the input terminal IN is low and the collector current of the transistor $Q_1$ is small, the base potential of the transistor $Q_3$ increases (becomes positive) to allow a base current to flow, and the transistor $Q_3$ is turned on (i.e. the collector-emitter become conductive) to shunt the audio signal to the ground. Then, no signal (this time, mainly noise signal) appears at the output terminal OUT.

As is apparent from the foregoing description, according to this invention the noise component of an FM demodulated signal is utilized to drive a switching element for the tuning indicator and/or the muting circuit, and therefore there is no possibility of giving any influence to the HF signal line while the degree of freedom in design is increased. Further since the fluctuation in the HF amplifier stage does not relate directly to the deflection of the indicator meter, the fluctuation of the indicator meter is very low. Further, since the quality of the received signal, changes in the S/N ratio by the change in the input signal level, multi-path interference, beat interference by mixed receiving, etc. is directly indicated in the meter, indication well corresponding to the S/N ratio in the auditory sense can be achieved. Further, the fluctuation of the indication in the meter can be improved while preventing the influence to other circuits and the audio output can be cut off when the input signal level is low with a poor S/N ratio by the use of a simple structure without using complicated means. Yet further, the manufacturing cost can be reduced due to the simplified structure. Therefore, this invention is particularly effective in an FM receiver of high sensitivity.

I claim:

1. A system adapted for use in a tuned FM receiver in order to control at least one of the functions of muting audio output from the receiver and providing an indication of the state of tuning of the receiver, said system comprising:

means for demodulating a received signal;
    means for extracting noise components from the demodulated signal;
    an automatic gain control amplifier joined to said extracting means for receiving and amplifying the noise components;
    a rectifier connected to said amplifier for rectifying amplified noise components and delivering a dc signal which changes in accordance with variations in the level of said noise components;
    means for directing said dc signal to the amplifier for biasing thereof to produce a controlling signal at an output of said amplifier; and
    means operatively joined to the amplifier and responsive to the controlling signal for performing said function.

2. A system according to claim 1, in which said noise extracting means includes a high pass filter for allowing only high frequency noise components to pass.

3. A system according to claim 1 for providing a tuning indication function, wherein said means responsive to the controlling signal is a tuning indicator driven by said controlling signal.

4. A system according to claim 1 for providing a muting function, wherein said means responsive to the controlling signal is a muting circuit connected to an audio signal transmitting line of the receiver and driven by said controlling signal to mute the audio signal.

5. A system adapted for use in a tuned FM receiver in order to control at least one of the functions of muting audio output from the receiver and providing an indication of the state of tuning of the receiver, said system comprising:

means for demodulating a received signal;
    means for extracting noise components from the demodulated signal, said noise-extracting means including a high pass filter for allowing only high frequency noise components to pass;
    an automatic gain control amplifier joined to said extracting means for receiving and amplifying the noise components passed by said filter, said amplifier having a first output terminal grounded through a capacitive element;

a rectifier connected to said amplifier for rectifying amplified noise components and delivering a dc voltage which changes in accordance with variations in the level of said noise components;

means for directing said dc voltage to the amplifier for biasing thereof to produce a controlling signal at an output of said amplifier; and means operatively joined to the amplifier and responsive to the controlling signal for performing said function.

6. A system according to claim 5 for providing a tuning indication function, wherein said means responsive to the controlling signal is a tuning indicator connected between said first output terminal and ground.

7. A system according to claim 5, in which said amplifier is provided with a second output terminal in a current path which includes an impedance, the amplifier and said capacitive element.

8. A system according to claim 7 for providing a muting function, wherein said means responsive to the controlling signal is a muting circuit connected to an audio signal transmitting line of the receiver and having a gate means joined to the second output terminal.

9. A system according to claim 8, in which said gate means is a transistor having a base connected to the second output terminal and a collector-emitter connected between a point in said audio signal transmitting line and ground.

10. A system according to claim 9, said system further comprising a tuning indicator connected between said first output terminal and ground.

* * * * *